United States Patent
Balakrishnan et al.

(10) Patent No.: US 9,702,924 B2
(45) Date of Patent: Jul. 11, 2017

(54) SIMULTANEOUSLY MEASURING DEGRADATION IN MULTIPLE FETS

(71) Applicant: International Business Machines Corporation, Armonk, NY (US)

(72) Inventors: Karthik Balakrishnan, White Plains, NY (US); Keith A. Jenkins, Sleepy Hollow, NY (US); Christos Vezyrtzis, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 14/716,070

(22) Filed: May 19, 2015

(65) Prior Publication Data

US 2016/0341785 A1    Nov. 24, 2016

(51) Int. Cl.
*G01R 31/26* (2014.01)

(52) U.S. Cl.
CPC ................. *G01R 31/2623* (2013.01)

(58) Field of Classification Search
None
See application file for complete search history.

(56) References Cited

U.S. PATENT DOCUMENTS

| | | | |
|---|---|---|---|
| 3,883,802 A | 5/1975 | Puri | |
| 5,561,373 A | 10/1996 | Itoh | |
| 5,625,288 A | 4/1997 | Snyder et al. | |
| 6,051,984 A | 4/2000 | Huang et al. | |
| 6,731,179 B2 | 5/2004 | Abadeer et al. | |
| 6,861,887 B2 | 3/2005 | Jeong et al. | |
| 7,176,695 B2 | 2/2007 | Bhushan et al. | |
| 7,397,261 B2 | 7/2008 | Hsu et al. | |
| 7,535,246 B2 | 5/2009 | Okawa | |
| 7,724,017 B2 | 5/2010 | Zhao | |
| 8,362,794 B2 | 1/2013 | Chen et al. | |
| 8,456,169 B2* | 6/2013 | Bhushan | G01R 31/2856 324/537 |
| 2007/0170947 A1 | 7/2007 | Utada | |
| 2008/0180134 A1* | 7/2008 | Jenkins | G01R 31/2621 327/77 |
| 2014/0354325 A1* | 12/2014 | Chang | G01R 31/2884 324/762.09 |

OTHER PUBLICATIONS

IBM, "Circuit for On-Chip Measurement of Change of ThresholdVoltage of Devices Due to Stress and Aging", IP.Com No. 000193032, Feb. 8, 2010, pp. 1-3.

* cited by examiner

*Primary Examiner* — Paresh Patel
(74) *Attorney, Agent, or Firm* — L. Jeffrey Kelly

(57) ABSTRACT

A structure and method of testing degradation of semiconductor devices by stressing an array of several semiconductor devices at the same time and measuring the resulting degradation separately for each individual device to obtain an estimate of its expected lifetime is provided. The devices may be subjected to stress that is either in a pulsed state or in a DC state. An on-chip pulse generator may be used for stressing in the pulsed state.

18 Claims, 9 Drawing Sheets

SIMULTANEOUSLY MEASURING DEGRADATION IN MULTIPLE FETS

BACKGROUND

Embodiments of the present invention relate generally to semiconductor devices, and more particularly to a structure and method of testing degradation of semiconductor devices.

Fabricated semiconductor devices with small physical dimensions may suffer from significant parameter variations. Additionally, as device dimensions become smaller these parameter variations may become larger. Reliability and parameter variation of these devices are vital to further expand applications of electronic circuitry. Measurement of a semiconductor device's degradation using a "stress" degradation test is utilized as a way to qualify fabricated devices for lifetime prediction. The degradation test may consist of applying a "stress" voltage to the device, followed by measuring the degradation resulting from application of the stress voltage. Application of the stress voltage may result in an increase of the device's threshold voltage, and in a reduction of carrier mobility within the device's channel, both of which lead to decreased device current. The reduction in device current is measured over a period of time for each device being tested to provide an indication of the device's reliability.

While conventional degradation tests may apply a static DC voltage to stress the device being tested, this may not adequately simulate what the device would actually experience in a digital circuit under real-use conditions. Under real-use conditions, device voltages may only remain on for very short time durations while the static DC stress may be applied for long time durations. Additionally, hot carrier degradation may also get exaggerated due to self-heating of the device with static DC voltage testing, especially when the applied DC stress pulses are longer than a thermal time constant, for example when current pulses are applied for a duration greater than hundreds of nanoseconds. Also, dynamic effects such as recovery between pulses may not be detectable when testing is done with static DC stress. As an alternative, stress may also be measured by applying short pulses. However, short pulses may introduce a measurement problem: in order to stress the device for a long enough time to measure degradation using short pulses, the measurement time may need to be impractically long.

SUMMARY

According to an embodiment of the invention, a device testing method is provided. The method may include measuring a first set of values of a current Idd through each field effect transistor (FET) in a plurality of FETs; applying a stress voltage to one of drains and sources of all of the plurality of FETs; applying at least one signal to gates of all of the plurality of FETs; removing the signal to the gates of all of the plurality of FETs; turning on individual gates of individual FETs of the plurality of FETs one by one in succession, and measuring a second set of values of the current Idd through individual FETs at instances when the individual gates of the individual FETs are turned on; and comparing the first set of values to the second set of values.

According to another embodiment, a structure for testing a plurality of field effect transistors (FETs) is provided. The structure may include a current measuring device configured to measure a first set of values of a current Idd through each FET in a plurality of FETs; a voltage source configured to apply a stress voltage to one of drains and sources of all of the plurality of FETs; a pulse signal source configured to apply and remove at least one signal to gates of all of the plurality of FETs; and a scan chain configured to turn on individual gates of individuals FETs of the plurality of FETs one by one in succession, wherein the current measuring device is configured to measure a second set of values of the current Idd through individual FETs at instances when the individual gates of the individual FETs are turned on.

BRIEF DESCRIPTION OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
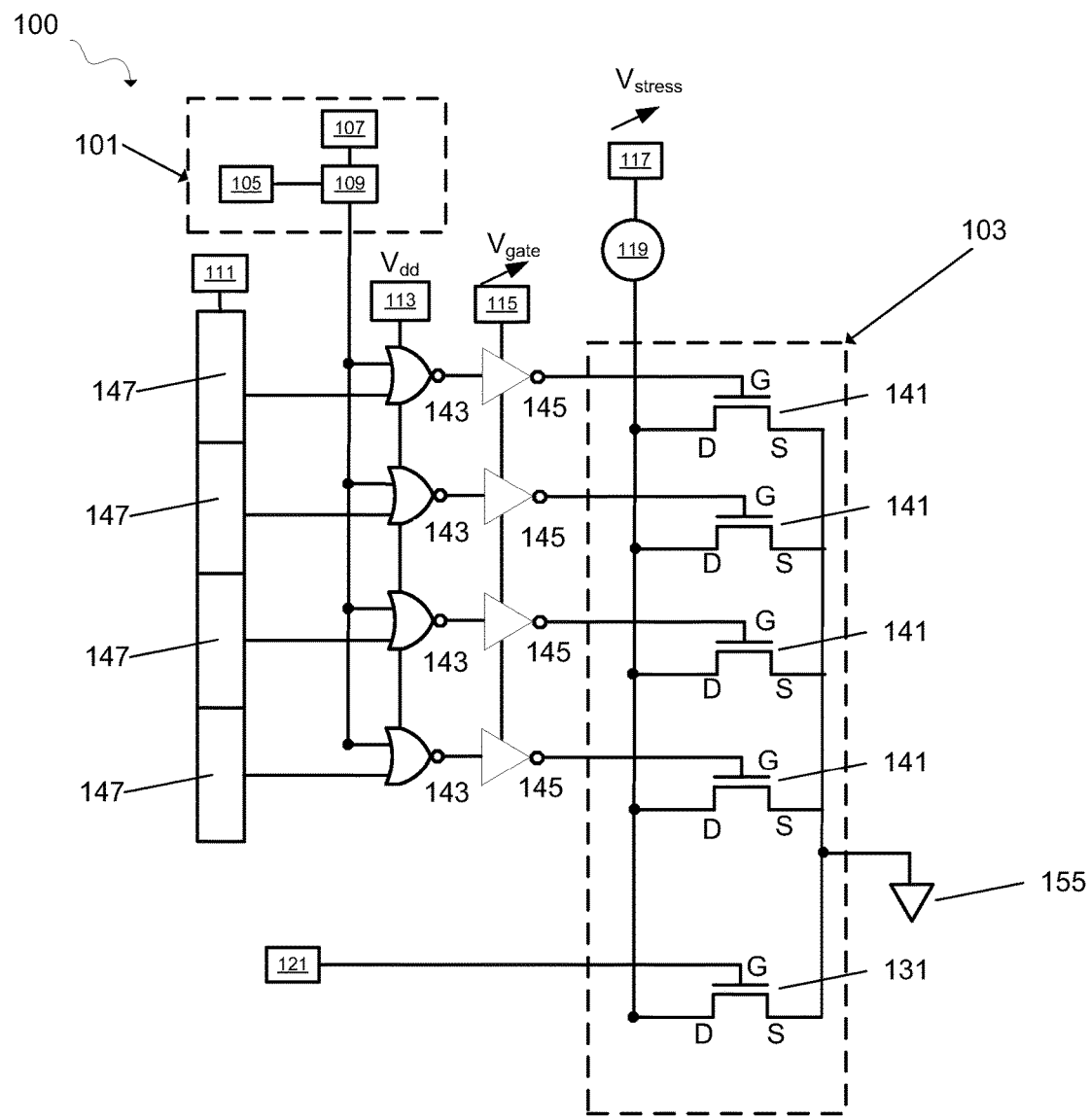
FIG. 1 illustrates a top level circuit diagram of an apparatus to test reliability of an array of negative channel field effect transistors (NFETs), according to an embodiment of the invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of the invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Semiconductor devices with small physical dimensions may suffer from charge-trapping which may affect the device's dielectric materials which in turn may affect its performance and reliability. Devices manufactured in the same batch may exhibit significant variations in their charge-trapping characteristics. Furthermore, as device dimensions continue to get smaller, parameter variation among individual devices in the same batch may become larger. Using a degradation test to measure device degradation is a way to qualify fabricated devices for lifetime prediction. The degradation test may consist of applying a "stress" voltage to the device, followed by measuring the degradation resulting from application of this stress voltage. During the stress phase, a device's threshold voltage may be increased gradually to a level that is outside of its normal operating range. This may result in the device's threshold voltage being increased, and in the carrier mobility within the device's channel being reduced, both of which lead to decreased device current. This reduction in device current constitutes "degradation" resulting from the applied stress, with a gradual decrease being measured over a period of time to constitute degradation test measurements. It is often a characteristic of a device undergoing a degradation test is that it may recover or "relax" from the stress if a measurement of the effect of the stress on the device is not made quickly enough. Therefore, the stress application period and the subsequent measurement period may need to be quite long to get a proper degradation measurement. However, after removal of the stress, even a millisecond may be too long to perform the measurement. This is true even when the stress voltage is pretty strong. It may take an even longer time to collect degradation data from a statistically significant number of devices from a given manufactured batch. Stressing several devices simultaneously in parallel may prevent the undesirable delay of having to stress each device sequentially.

Degradation generated during the stress test may also permanently affect a device's lifetime performance. Stressing with pulse signals, instead of a static DC voltage, may reduce the degradation caused by testing, permitting a longer device lifetime, especially when the pulsed signals consist of short pulses applied in a low duty cycle. This reduction in degradation may be due to factors such as reduced self-heating and increased damage relaxation.

In effect, pulsed stress may constitute several repetitions of applying a short DC stress interrupted by time periods when no stress is applied. During pulse stress, since the stress application is interrupted rather than being continuous, the resulting degradation is at least partially recovered causing self-heating to be reduced or eliminated. The pulse stress may also create interface traps that may end up partially annealed, or repaired, during the time the stress is off. Because of this recovery or self-annealing behavior, the pulsed stress technique may be a better predictor of device lifetime as it may more closely simulate in-circuit, real-use conditions by applying a periodic stress that mimics the stress that would be experienced by the device in-circuit. Pulsed stress may also provide insights into a device's reliability behaviors that may not be available with static DC stressing. Stressing with one or more pulse signals while simultaneously measuring the DC current may thus provide good charge trapping measurements. Pulsed stress may also complement traditional static DC stressing to provide a better understanding of a device's reliability.

While degradation caused by the stress may be further minimized by using short pulses, one disadvantage of stressing with short pulses is that, in order to measure degradation caused by such short pulses, the degradation measurement time may have to be extended to a longer duration to generate a level of stress comparable to a typical static DC stress signal or a long pulse signal. One way this disadvantage can be overcome is to combine a large array of devices (devices under test or "DUT") in a single test circuit, stressing several devices with short pulses at the same time, and measuring the resulting degradation separately for each individual device in the array. This may allow for the pulsed measurements to be short enough to avoid the effect of self-heating and the effect of device relaxation following the stress before the measurement could be completed. The stress applied may be in the form of either a hot carrier injection (HCI) type or a bias-temperature instability (BTI) type, depending on the voltages applied. Following the stressing, a scan chain may sequentially select for degradation measurement each device in an array of DUTs.

Typical degradation measurements with static DC stress signals may consist of a series of stress and measurement phases with each stress phase including application of a prolonged stress voltage for a period of between approximately 1 microsecond and approximately 10 seconds, or longer. The duration of each stress phase may typically be increased exponentially as the degradation proceeds. The total stress time in a static DC stress method may typically vary between approximately 1000 and approximately 10,000 seconds.

Embodiments of the present invention, on the other hand, may include a stress phase consisting of a series of short pulses whose aggregate pulse time may also typically vary between approximately 1 microsecond and approximately 10 seconds, or longer. This may result in the gate terminals of all devices in an array of DUT to be subjected to alternating short bursts of voltage followed by periods of zero voltage. The duration of each short pulse may be very short, varying between less than 1 nanosecond and approximately 100 nanoseconds, with long off-times in between the short pulses. The long time between pulses may be needed to simulate conditions closely similar to a circuit operation. The device current of each individual device may then be measured one by one by a scan chain.

Embodiments of the present invention relate generally to semiconductor devices, and more particularly to a structure and method of testing degradation of semiconductor devices by stressing an array of semiconductor devices at the same time and measuring the resulting degradation separately for each individual device to obtain an estimate of its expected lifetime, are described in detail below with reference to FIGS. 1-9. The devices may be subjected to stress that is either in a pulsed state or in a DC state. An on-chip pulse generator may be used for stressing in the pulsed state.

Referring now to FIG. 1, a structure 100 used to test reliability of an array of negative channel field effect transistors (NFETs) is shown. Structure 100 may illustrate one embodiment of a circuit used to test an array consisting of a plurality of NFET devices under test (DUT). With minor modifications in the circuitry, structure 100 may also be used to test degradation of a DUT array of positive channel field effect transistors (PFETs) as described with reference to FIGS. 6-9.

Structure 100 may include one or more arrays of devices under test such as (DUT) array 103, each array including a plurality NFETs 141 to be tested, each NFET 141 including a source S, drain D, and a gate G, which may be connected in parallel, a gate stress block 101 that includes a pulse enable 105, a clock 107, and a pulse/clock selector 109, a scan chain 111 that includes several scan chain latch segments 147, a common voltage source 113 that may supply voltage Vdd to NOR gates 143, and a gate voltage source 115 that may supply voltage Vgate to NOT gates 145, gates G of NFETs 141 that may be supplied by the NOT gates 145, a single voltage source 117 that may apply an adjustable stress voltage Vstress to drains D of NFETs 141, a current measuring device 119, a calibrator 121, a reference NFET 131, and sources S of NFETs 141 connected to a common ground 155.

In various embodiments, the gate stress block 101 is capable of applying a pulse signal to stress the NFETs 141 in a DUT array 103. In one embodiment, the pulse signal may be replaced with a static DC signal. The gate stress block 101, which will be explained in additional detail in FIG. 2, may include a pulse/clock selector 109 that is configured to connect or disconnect either a pulse enable 105 or a clock 107 to the DUT array 103. The scan chain 111 enables performing simultaneous pulsed stress on each NFET 141 within the DUT array 103. In an alternate embodiment, the scan chain 111 may be a finite state machine.

The NOR gates 143 may share the common power supply Vdd from the common voltage source 113, and the common ground 155. The output from each NOR gate 143 may drive a NOT gate 145, with all of the NOT gates 145 sharing a common independent power supply Vgate from the gate voltage source 115. The output from the NOT gates 145 may drive the gates G of NFETs 141. The sources S of the NFETs 141 may be connected to the common ground 155 while the drains D of each NFET 141 may be held at voltage Vstress supplied from the single voltage source 117. The current measuring device 119 may measure the current Idd passing through each individual NFET 141 being tested. In other words, the current measuring device 119 may measure the current between Vstress and the common ground 155 as impacted by the stress caused by the pulse signal or the DC signal output from the gate stress block 101. The reference NFET 131 may represent a reference NFET that is not subjected to stress, and may be connected to a calibrator 121 supplying power to the reference NFET 131 at an independent external voltage.

In various embodiments, the measuring of degradation for a plurality of NFETs 141 in the DUT array 103 under test may be conducted using a stress test that includes several alternating stress and measurement phases may be applied to each of the plurality of NFETs 141. As an illustrative example, in one embodiment where drain current through each of the plurality of NFETs 141 may represent a parameter chosen for observation during the stress test, a first measurement phase may occur prior to applying a first stress to the NFETs 141, and drain current values of each NFET 141 in the DUT array 103 may be measured and recorded to yield a first set of current Idd measurements through each of the NFETs 141 to yield a first set of measurements M0. A stressing phase may be carried with a first stress applied. This may be followed by a second measurement phase where a second set of current Idd measurements M1 may be recorded. A second stress phase may then be carried out by applying a second stress, followed by a third measurement phase where a third set of current Idd measurements M2 may be recorded. Similarly, n stress phases may be applied and n+1 sets of current Idd measurements may be obtained. The n+1 sets of current Idd measurements may then be examined to determine how the parameter of the NFETs 141 chosen for observation varied before, during and after each stress phase. The current Idd measurements recorded after each stress phase may then be plotted versus a cumulated stress time on a graph. If the data indicates that the current Idd "flattens out" (i.e. it does not change) during the last few successive stress phases, then the measurements recorded may be considered adequate and the stress test may be concluded at that point. On the other hand, if the current Idd is observed to still vary significantly even after the nth stress phase, then several additional alternating stress and measurement phases may be conducted until the current Idd may flatten out, as described above. Thus, the number of stress and measurement phases may be dependent on the variation in the observed parameter before, during and after each stress phase. The number of stress and measurement phases may also be dependent on the variation in the observed parameter in response to the cumulated stress time.

Referring to FIG. 1, in one embodiment, the device depicted in structure 100 may be used to conduct the stress test as follows. During the stressing phase, a sequence of inputs may be applied. A stress voltage Vstress from the single voltage source 117 may start to be applied to drains D of all the NFETs 141 of the DUT array 103. In one embodiment, the stress voltage Vstress may be achieved by setting the scan chain 111 to propagate all zeros while the pulse enable 105 and clock 107 of the gate stress block 101 may both be set to generate a pulse signal. In an alternate embodiment, the pulse enable 105 and the clock 107 may both be set to generate a DC signal. In one embodiment, the pulse signal may be applied simultaneously to gates G of all of the NFETs 141 in the DUT array 103 for a predetermined duration of time. The application of both the Vstress and the pulse signal may result in hot carrier injection (HCI) stress of all NFETs 141 when Vstress is greater than zero and in bias temperature instability (BTI) stress of all NFETs 141 when Vstress is zero.

A measurement phase may immediately follow the stressing phase, with a sequence of inputs being applied and outputs being measured. In one embodiment, the pulse signal from the gate stress block 101 may be removed by turning the pulse signal off, and the voltage Vstress applied from the single voltage source 117 may accordingly be changed to a value suitable for conducting measurements of current Idd, the current across each individual NFET 141. The scan chain 111 may then be operated so that a 1 propagates through the chain causing a voltage Vgate to flow from the gate voltage source 115 via the NOT gates 145 to turn on the gates G of each individual NFET 141, one by one, in succession. Turning on each gate G of the NFETs 141 in succession may cause current Idd, to be conducted through each selected NFET 141, thereby enabling measurement of that current Idd through that particular NFET 141 alone. If the previously applied stress has degraded the NFET, then its current may be different from a value recorded prior to the start of the test, i.e., the current Idd through that particular NFET 141 may be degraded (a first set of values of current Idd). As the gate G of each NFET 141 is turned on one at a time, a current Idd of each NFET may be measured individually at an instant when each gate G is turned on, to provide a second set of values of the current Idd through each of the NFETs 141. For an array of n NFETs 141 within the DUT array 103, n values of the degraded current Idd corresponding to n NFETs 141 may be measured by the current measuring device 119. Each of the second set of measured n current Idd values may provide an indication of degradation caused in each NFET 141 corresponding to the applied stress caused by the earlier pulse signal applied from the gate stress block 101. In various embodiments, the values of Vstress and Vgate may be set to various predetermined values, and current Idd values may be measured for those different Vstress and Vgate combinations for each of the n NFETs 141 of the DUT array 103. At the completion of the measurement phase, another stress phase may immediately follow. The NFETs 141 under test may thus be subjected to additional alternate stress and measurement phases until such time an observed parameter flattens out, as described above. At that point, it may be determined that the collected degradation measurements are adequate to predict variation in a parameter of each of n NFETs 141 being tested in real-use conditions. It should be noted that comparing the first set of current Idd values with the second and subsequent sets of current Idd values may provide a prediction as to how the NFETs 141 may degrade when subjected to several intermittent stress signals in real-use conditions.

Figure 2:
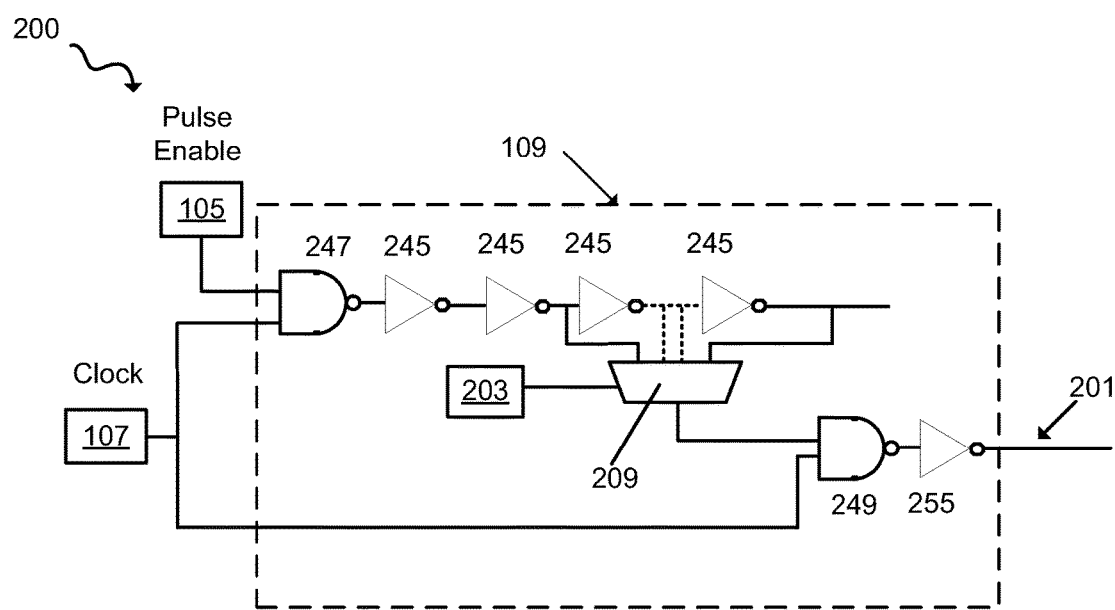
FIG. 2 illustrates a top level circuit diagram of a gate stress block capable of generating signals used to test reliability of an array of field effect transistors (FETs), according to an embodiment of the invention.

Referring now to FIG. 2, a detailed circuit diagram of the gate stress block 101 of FIG. 1 is shown. Structure 200 may represent one embodiment of the gate stress block 101 which may consist of the pulse enable 105, the clock 107, and the pulse/clock selector 109, and may output an output signal 201 to the gates of the NOR gates 143 (FIG. 1). The pulse/clock selector 109 may include an upper NAND gate 247, a lower NAND gate 249, one or more upper inverters 245, one or more odd number of lower inverters 255, a multiplexor 209, and one or more digital control signal controllers 203 controlling the multiplexor 209. The number of digital signal controllers 203 that control the multiplexor 209 may depend on the number of inputs that the multiplexor 209 may receive. As an example, in an embodiment where multiplexor 209 may receive 8 different inputs, there may be three digital signal controllers 203 controlling the multiplexor 209. In various embodiments, the pulse enable 105 may be a digital signal source that determines whether the output signal 201 is equal to a signal from the clock 107, or alternately whether it is equal to pulses of varying widths generated by the pulse/clock selector 109.

The clock 107 may represent a variable duty cycle clock capable of outputting clock signals of various frequencies, either from external equipment, or from an on-chip clock generator such as a voltage-controlled oscillator (VCO). In various embodiments, the signal from the clock 107 may be of various widths and frequencies. In one embodiment, the clock 107 may represent a low frequency input clock capable of outputting a signal consisting of short pulses. In one embodiment, the clock 107 may represent a low frequency input clock that directly drives the gates G of the NFETs 141. In one embodiment, the signal from the clock 107 may constitute a DC logical "1" or "0" level. When the pulse enable 105 is set to a logical "0" level, the output signal 201 may be exactly same as the signal from the clock 107.

When the pulse enable 105 is set to a logical "1," a short pulse may be created based on combining an incoming clock signal with a delayed signal passing through the upper NAND gate 247 and the delayed path consisting of the upper inverters 245. The multiplexor 209 may select a signal from one stage of the delay path as routed by the upper inverters 245, and output the selected signal as an input to the lower NAND gate 249 and the lower inverter 255. In selecting the signal, the multiplexor 209 may choose the exact delay path that may be required in order to generate a predetermined width of the output signal 201. The multiplexor may accomplish this by feeding a delayed version of the input signal from the clock 107 to the upper port of the lower NAND gate 249 and eventually the desired version of the output signal 201 is delivered to the NOR gates 143 (FIG. 1).

Figure 3:
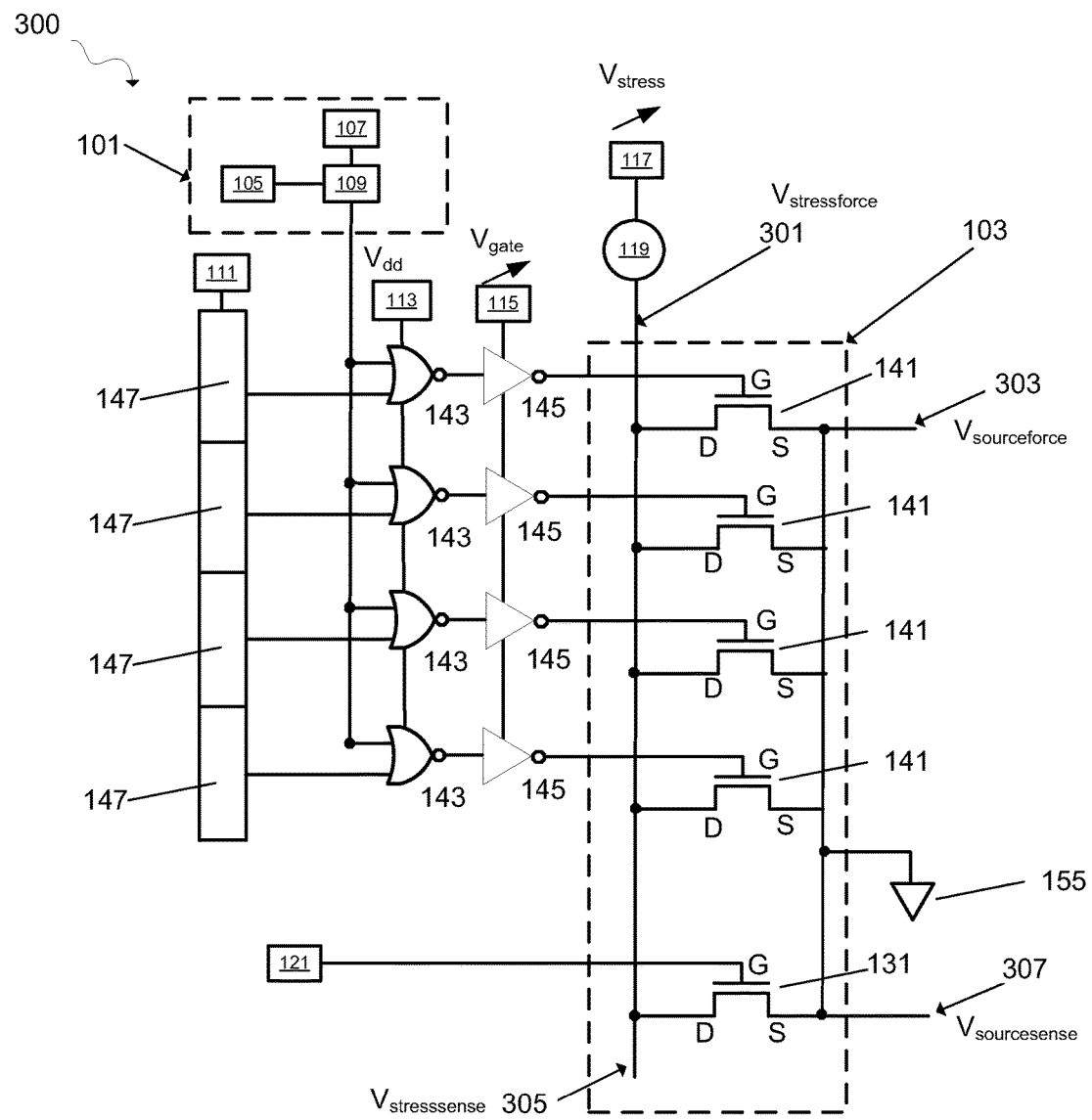
FIG. 3 illustrates a top level circuit diagram of an alternate apparatus to test reliability of an array of NFETs, according to an embodiment of the invention.

Referring now to FIG. 3, a structure 300 used to test reliability of a plurality of NFETs is shown. Structure 300 may represent alternate circuitry to measure degradation of NFETs based on a four point Kelvin measurement technique which may more accurately sense a true voltage resulting from a voltage that is applied to the DUT array during stress and measurement phases. The sensed true voltage may typically be slightly reduced when compared to the applied voltage due to resistive losses within the DUT array circuit.

The degradation testing based on a four point Kelvin measurement technique may be carried out by modifying the circuit described in FIG. 1 by applying a desired drain voltage Vstressforce to the drains D of the NFETs 141 at a terminal 301 and a desired source voltage Vsourceforce to the sources S of the NFETs 141 at a terminal 303. A true drain voltage Vstresssense may then be measured at a terminal 305 while a true source voltage Vsourcesense may be measured at a terminal 307. The stressing phase and the subsequent measuring phase may be repeated as often as desired to obtain more than one set of degradation measurements.

Figure 4:
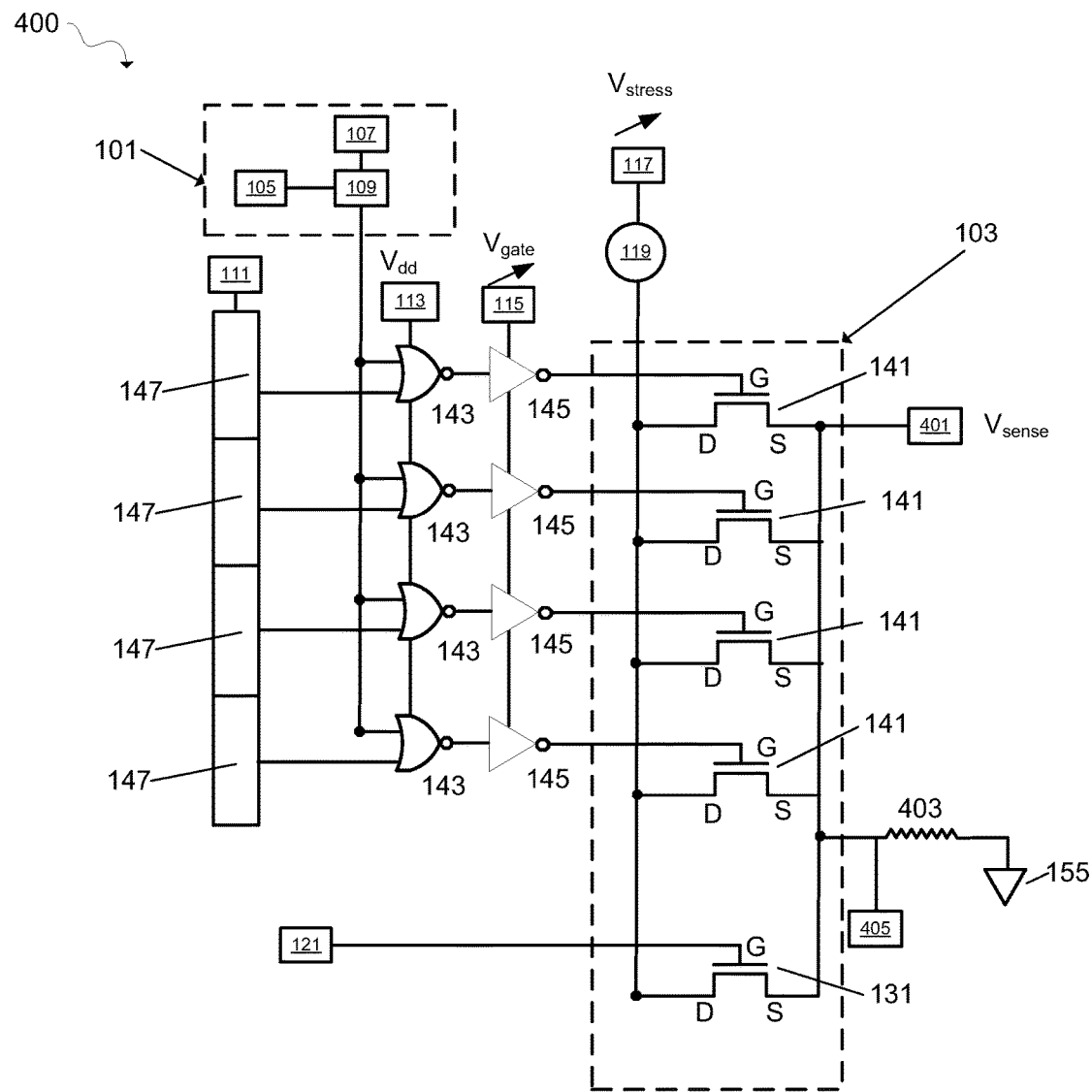
FIG. 4 illustrates a top level circuit diagram of an alternate apparatus to test reliability of an array of NFETs, according to an embodiment of the invention.

Referring now to FIG. 4, a structure 400 used to test reliability of a plurality of NFETs is shown. Structure 400 may represent an alternate circuitry to measure degradation of NFETs. In one embodiment of the circuit for measuring device degradation, in addition to including all device components described with reference to FIG. 1, the sources S of all NFETs 141 in the DUT array 103 of the circuit may be connected to the common ground 155 via a current sink 405 or a resistor 403. In one embodiment, the resistor 403 may represent a fixed resistor. The circuit may also include a terminal 401 at which the voltage Vsense at a source S of a selected NFET 141 may be measured. Unlike FIG. 1 wherein the current Idd through a selected NFET 141 may be measured, the circuit configuration of FIG. 4 may allow the measurement of a voltage (i.e., Vsense) through a selected NFET 141 at the terminal 401. In various embodiments, in the degradation testing circuit described in FIG. 1, the leakage current of all the other non-selected NFETs 141 may be indistinguishable from the current Idd through an individual NFET 141 selected for measurement. For a large array of NFETs such as DUT array 103, the sum of leakages of all the other non-selected NFETs 141 may become large in comparison to the on-current (i.e., current Idd) of the individual NFET 141 selected for measurement. However, this background current may be reduced by lowering the gate-to-source voltage of the other non-selected NFETs 141 by connecting a resistor to the sources S of the other non-selected NFETs 141. By incorporating the resistor 403, the voltage at the source S of the NFET 141 being selected for measurement may now be a positive value instead of zero, and this non-zero voltage Vsense may be measured at the terminal 401. At the same time, the gate-to-source voltage of all the other non-selected NFETs 141 except the NFET 141 selected for measurement, instead of 0 V when there is no resistor 403, may now be maintained at a negative value such as, for example, −0.1V, thereby causing a reduction in the leakage current through the non-selected NFETs 141. Since the gate-to-source voltage of the NFET 141 selected for measurement is now non-zero, this non-zero degradation voltage Vsense is capable of being measured instead of, or in addition to, the current Idd to constitute a third set of values consisting of voltages through the NFETs 141. In one embodiment where the current sink 405 may be enabled during the stress phase, the current sink 405 may be set to 0V to ground all of the sources S of the NFETs 141. However during the measurement phase, the current sink 405 may be disabled resulting in the source S of the selected NFET 141 rising to a higher voltage (~0.1V) as described above.

Figure 5:
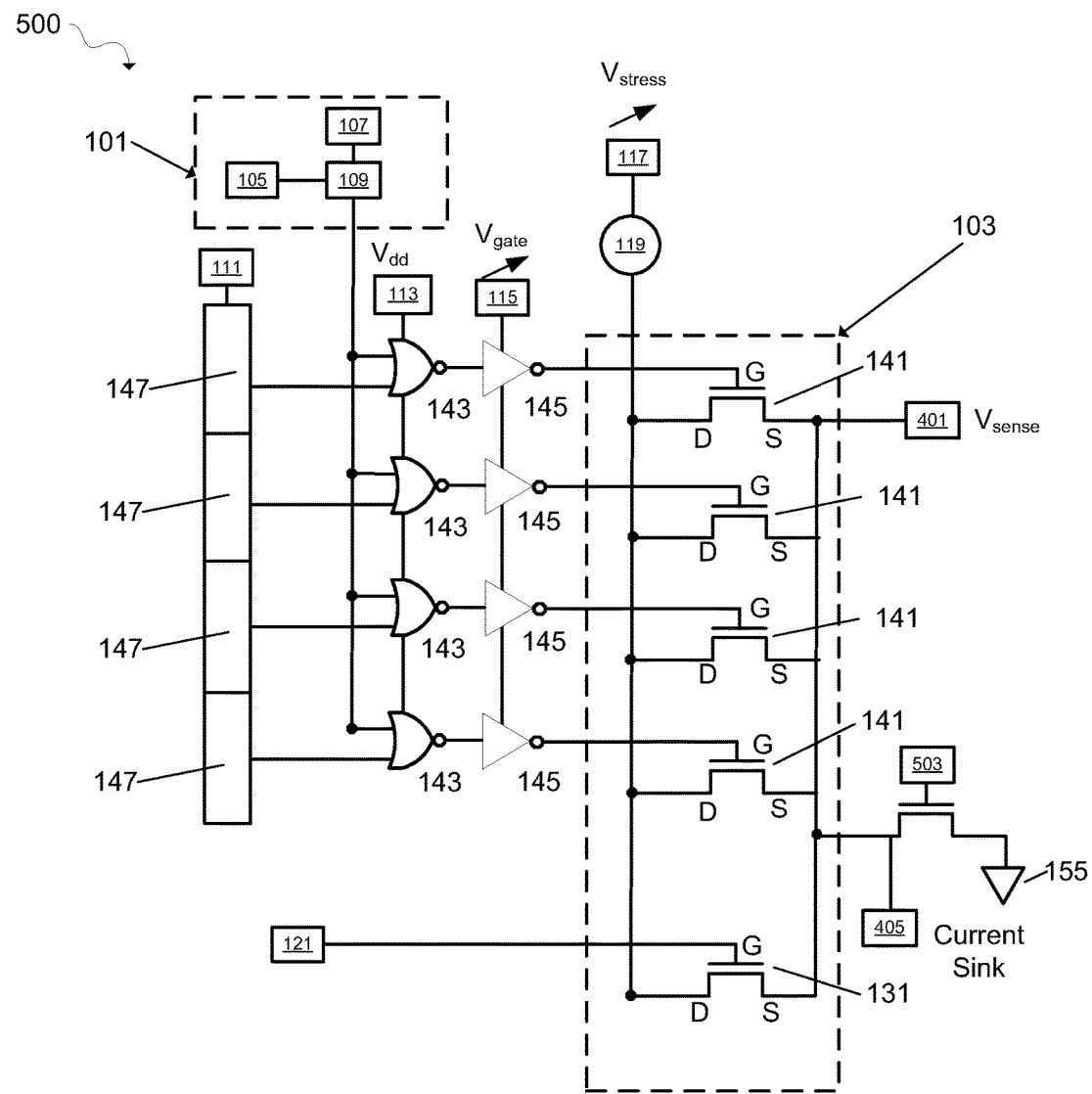
FIG. 5 illustrates a top level circuit diagram of an alternate apparatus to test reliability of an array of NFETs, according to an embodiment of the invention.

Referring now to FIG. 5, a structure 500 used to test reliability of a plurality of NFETs is shown. Structure 500 may represent an alternate means to measure degradation of NFETs wherein the sources S of all NFETs 141 in the DUT array 103 may be connected to a single variable load FET 503 whose gate voltage may be adjusted. The circuit described in FIG. 5 may, similar to the circuit described in FIG. 4, help minimize or nullify the effect of leakage currents through the other non-selected NFETs 141 on the measured value of current Idd through a selected NFET 141. For example, when a single NFET 141 is selected for measuring the effect of degradation, the single variable load FET 503 may be turned on by raising its gate voltage while the voltage Vsense at terminal 401 may be at increased to, say, 0.1 V. instead of 0 V as may be the case in the circuit described in FIG. 1. As a result, the gate-to-source voltage of all the other non-selected NFETs 141 may now be at negative 0.1V (−0.1V) instead of 0 V, thereby causing a reduction in the leakage current through the other non-selected NFETs 141. In addition, since the gate-to-source voltage is now non-zero, this non-zero degradation voltage Vsense may be measured at terminal 401 instead of, or in addition to, the current Idd.

Figure 6:
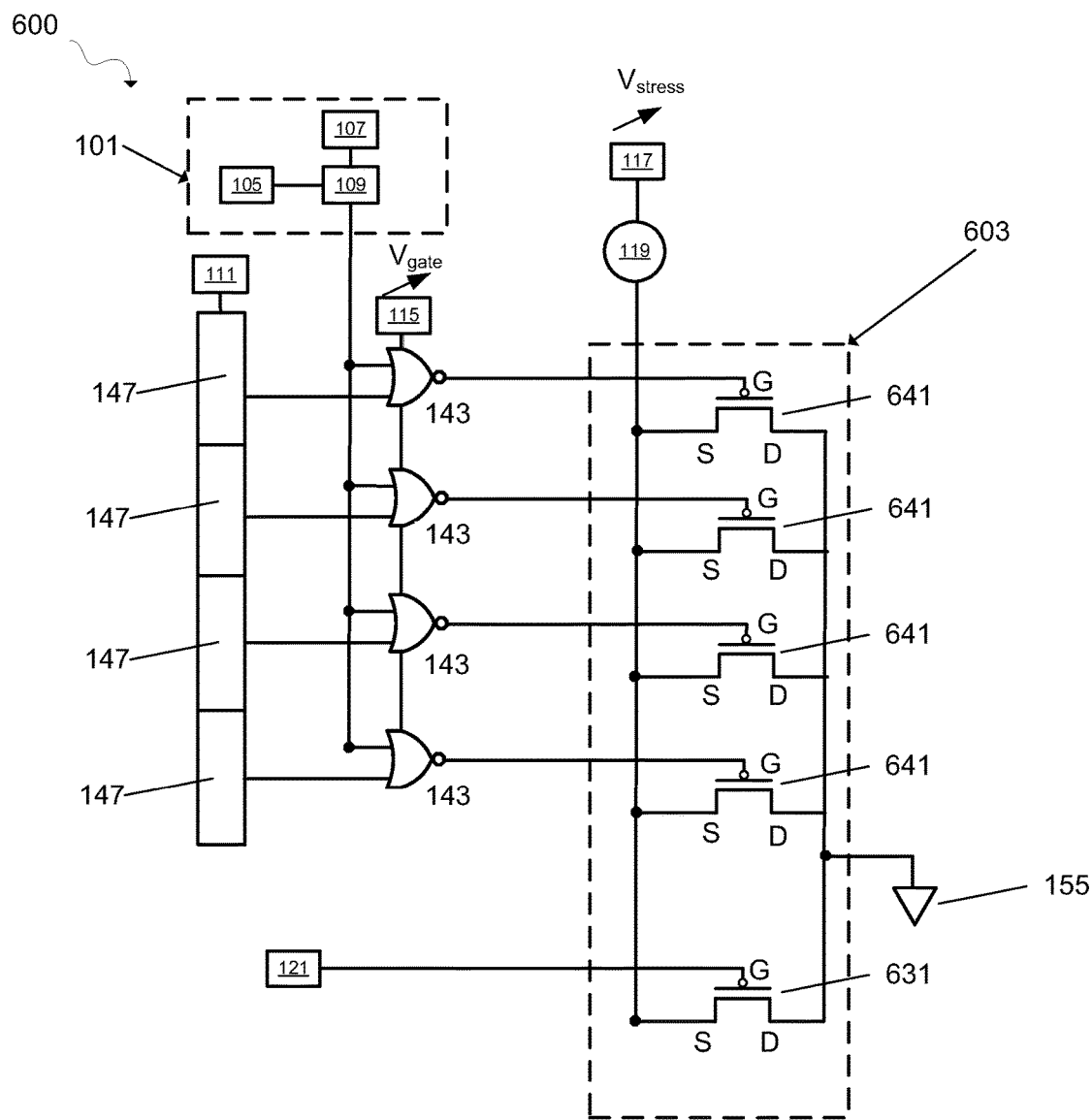
FIG. 6 illustrates a top level circuit diagram of an alternate apparatus to test reliability of an array of positive channel field effect transistors (PFETs), according to an embodiment of the invention.

Referring now to FIG. 6, a circuit used to test reliability of a plurality of positive channel field effect transistors (PFETs) is shown. Structure 600 may illustrate one embodiment of a circuit used to test an array of PFET devices under test (DUT), and may include a gate stress block 101, one or more devices under test (DUT) arrays 103, each array including a plurality of PFETs 641 under test which may be powered in parallel, the pulse enable 105, the clock 107, the pulse/clock selector 109, the scan chain 111 including several scan chain latch segments 147, the gate voltage source 115 that may supply voltage Vgate to NOR gates 143 that may in turn supply gates G of PFETs 641, the single voltage source 117 that may apply an adjustable stress voltage Vstress to sources S of PFETs 641, the current measuring device 119, the calibrator 121, a reference PFET 631, and drains D of PFETs 641 connected to a common ground 155.

As explained with reference to FIG. 1, the gate stress block 101 is capable of applying either a pulse signal or a DC signal to stress a plurality of PFETs 641 in the DUT array 603 while the scan chain 111 enables performing simultaneous pulsed stress on each PFET 641 within the DUT array 603. The NOR gates 143 may share the common power supply Vgate from the gate voltage source 115 and the common ground 155. The output from each NOR gate 143 may drive the gates G of PFETs 641 under test with the respective sources S of each PFET 641 being held at voltage Vstress supplied from a single voltage source 117, and their drains D being connected to a common ground 155. The current measuring device 119 may be used to measure the current passing through each individual PFET 641 under test. The reference PFET 631 may represent a reference PFET that is not subjected to stress, and may be connected to a calibrator 121 supplying power to the reference PFET 631 at an independent external voltage.

In various embodiments, the measuring of degradation for a plurality of PFETs 641 in the DUT array 603 under test may be conducted using a stress test that includes several alternating stress and measurement phases may be applied to each of the plurality of PFETs 641. As an illustrative example, in one embodiment where source current through each of the plurality of PFETs 641 may represent a parameter chosen for observation during the stress test, a first measurement phase may occur prior to applying a first stress to the PFETs 641, and source current values of each PET 641 in the DUT array 603 may be measured and recorded to yield a first set of current Idd measurements through each of the PFETs 641 to yield a first set of measurements M0. A stressing phase may be carried with a first stress applied. This may be followed by a second measurement phase where a second set of current Idd measurements M1 may be recorded. A second stress phase may then be carried out by applying a second stress, followed by a third measurement phase where a third set of current Idd measurements M2 may be recorded. Similarly, n stress phases may be applied and n+1 sets of current Idd measurements may be obtained. The n+1 sets of current Idd measurements may then be examined to determine how the parameter of the PFETs 641 chosen for observation varied before, during and after each stress phase. The current Idd measurements recorded after each stress phase may then be plotted versus a cumulated stress time on a graph. If the data indicates that the current Idd "flattens out" (i.e. it does not change) after the last few stress phases, then the measurements recorded may be considered adequate and the stress test may be concluded at that point. On the other hand, if the current Idd is observed to still vary significantly even after the nth stress phase, then several additional alternating stress and measurement phases may be conducted until the current Idd may flatten out, as described above. Thus, the number of stress and measurement phases may be dependent on the variation in the observed parameter before, during and after each stress phase. The number of stress and measurement phases may also be dependent on the variation in the observed parameter in response to the cumulated stress time.

Referring to FIG. 6, in one embodiment, the device depicted in structure 600 may be used to conduct the stress test as follows. During the stressing phase, a sequence of inputs may be applied. A stress voltage Vstress from the single voltage source 117 may start to be applied to sources S of all the PFETs 641 of the DUT array 603. The scan chain 111 may then be set to propagate all zeros while the pulse enable 105 and clock 107 of the gate stress block 101 may both be set to generate a pulse signal. In an alternate embodiment, the pulse enable 105 and the clock 107 may both be set to generate a DC signal. In one embodiment, the pulse signal may be applied simultaneously to gates G of all of the PFETs 641 in the DUT array 603 for a predetermined duration of time. The application of both the Vstress and the pulse signal may result in hot carrier injection (HCI) stress of all PFETs 641 when Vstress is greater than zero and in bias temperature instability (BTI) stress of all PFETs 641 when Vstress is zero.

A measurement phase may immediately follow the stressing phase, with a sequence of inputs being applied and outputs being measured. In one embodiment, the pulse signal from the gate stress block 101 may be removed by turning the pulse signal off, and the voltage Vstress applied from the single voltage source 117 may accordingly be changed to a value suitable for conducting measurements of current Idd, the current across each individual PFET 641. The scan chain 111 may then be operated so that a 1 propagates through the chain causing a voltage Vgate to flow from the gate voltage source 115 via the NOT gates 145 to turn on the gates G of each individual PFET 641, one by one, in succession. Turning on each gate G of the PFETs 641 in succession may cause current Idd, to be conducted through each selected PFET 641, thereby enabling measurement of that current Idd through that particular PFET 141 alone. If the previously applied stress has degraded the PFET, then its current may be different from a value recorded prior to the start of the test, i.e., the current Idd through that particular PFET 641 may be degraded (a first set of values of current Idd). As the gate G of each PFET 641 is turned on one at a time, a current Idd of each PFET may be measured individually at an instant when each gate G is turned on, to provide a second set of values of the current Idd through each of the PFETs 641. For an array of n PFETs 641 within the DUT array 603, n values of the degraded current Idd corresponding to n PFETs 641 may be measured by the current measuring device 119. Each of the second set of measured n current Idd values may provide an indication of degradation caused in each PFET 641 corresponding to the applied stress caused by the earlier pulse signal applied from the gate stress block 101. In various embodiments, the values of Vstress and Vgate may be set to various predetermined values, and current Idd values may be measured for those different Vstress and Vgate combinations for each of the n PFETs 641 of the DUT array 603. At the completion of the measurement phase, another stress phase may immediately follow. The PFETs 641 under test may thus be subjected to additional alternate stress and measurement phases until such time an observed parameter flattens out, as described above. At that point, it may be determined that the collected degradation measurements are adequate to predict variation in a parameter of each of n PFETs 641 being tested in real-use conditions. It should be noted that comparing the first set of current Idd values with the second and subsequent sets of current Idd values may provide a prediction as to how the PFETs 641 may degrade when subjected to several intermittent stress signals in real-use conditions.

Figure 7:
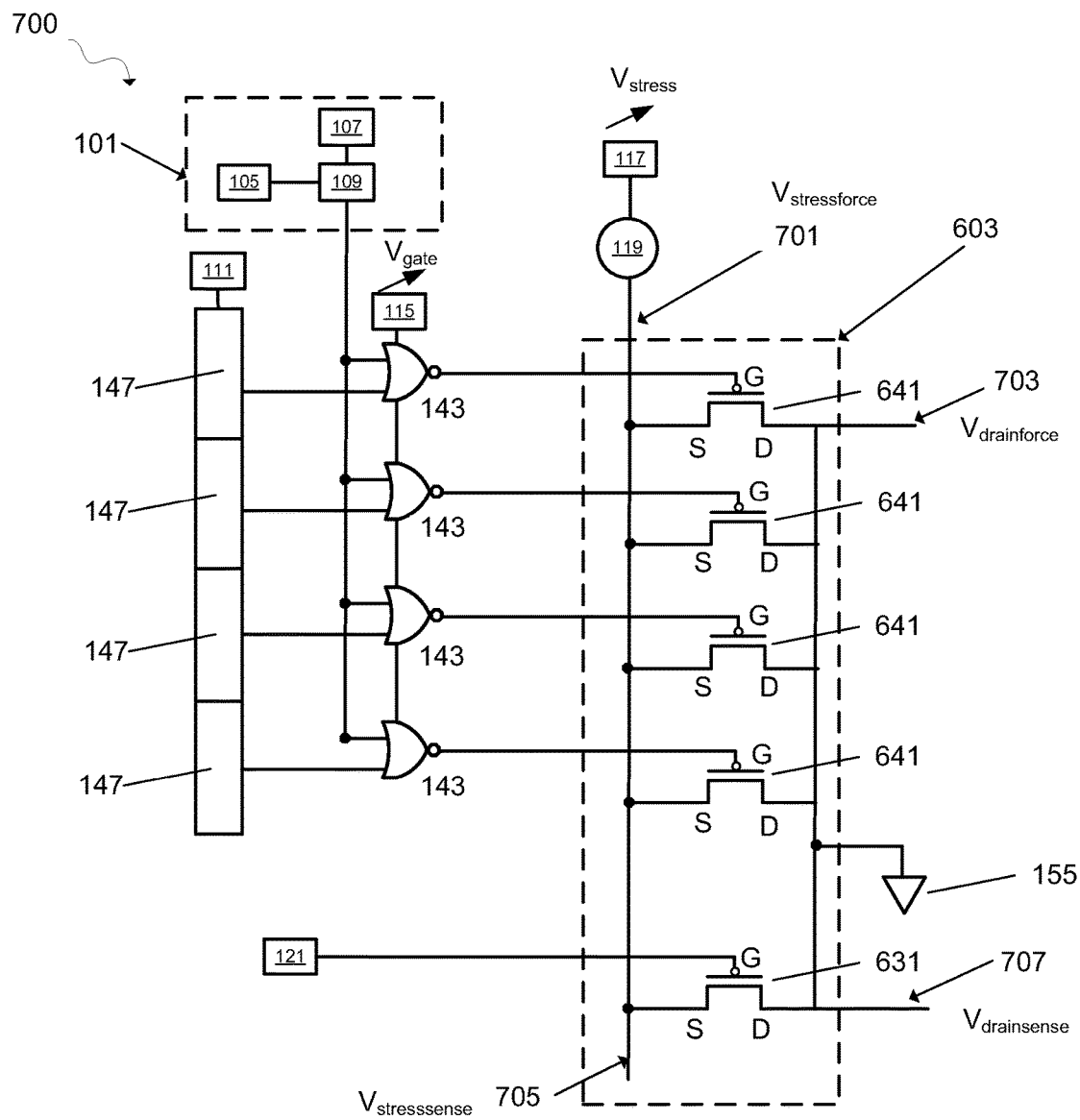
FIG. 7 illustrates a top level circuit diagram of an alternate apparatus to test reliability of an array of PFETs, according to an embodiment of the invention.

Referring now to FIG. 7, a structure 700 used to test reliability of a plurality of PFETs is shown. Structure 700 may represent an alternate circuitry to measure degradation of PFETs based on a four point Kelvin measurement technique which may more accurately sense a true voltage resulting from a voltage that is applied to the DUT array during stress and measurement phases. The sensed true voltage may typically be slightly reduced when compared to the applied voltage due to resistive losses within the DUT array.

The degradation testing based on a four point Kelvin measurement technique may be carried out by modifying the circuit described in FIG. 6 by applying a desired source voltage Vstressforce to the sources S of the PFETs 641 at a terminal 701 and a desired drain voltage Vsourceforce to the drains D of the PFETs 641 at a terminal 703. A true source voltage Vstresssense may then be measured at a terminal 705 while a true drain voltage Vsourcesense may be measured at a terminal 707. The stressing phase and the subsequent measuring phase may be repeated as often as desired to obtain more than one set of degradation measurements.

Figure 8:
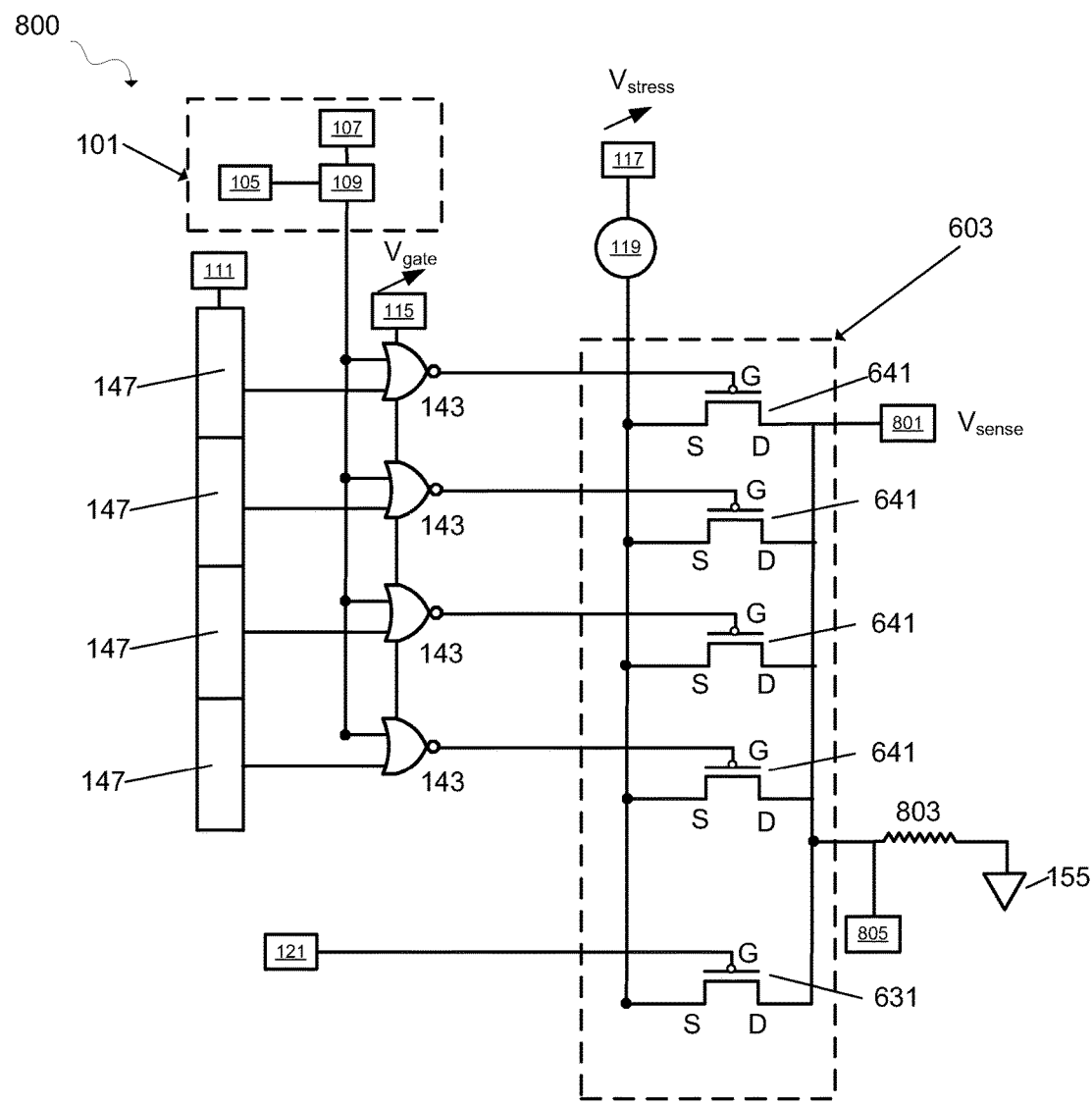
FIG. 8 illustrates a top level circuit diagram of an alternate apparatus to test reliability of an array of PFETs, according to an embodiment of the invention.

Referring now to FIG. 8, a structure 800 used to test reliability of a plurality of PFETs is shown. Structure 800 may represent an alternate circuitry to measure degradation of PFETs. In one embodiment of the circuit for measuring device degradation, in addition to including all device components described with reference to FIG. 6, the drains D of all PFETs 641 in the DUT array 603 of the circuit may be connected to the common ground 155 via a current sink 805 or a resistor 803. In one embodiment, the resistor 803 may represent a fixed resistor. The circuit may also include a terminal 801 at which the voltage Vsense at a drain D of a selected PFET 641 may be measured. Unlike FIG. 6 wherein the current Idd through a selected PFET 641 may be measured, the circuit configuration of FIG. 8 may allow the measurement of a voltage (i.e., Vsense) through a selected PFET 641 at the terminal 801. In various embodiments, in the degradation testing circuit described in FIG. 6, the leakage current of all the other non-selected PFETs 641 may be indistinguishable from the current Idd through an individual PFET 641 selected for measurement. For a large array of PFETs such as DUT array 603, the sum of leakages of all the other non-selected PFETs 641 may become large in comparison to the on-current (i.e., current Idd) of the individual PFET 641 selected for measurement. However, this background current may be reduced by lowering the gate-to-drain voltage of the other non-selected PFETs 641 by connecting a resistor to the drains D of the other non-selected PFETs 641. By incorporating the resistor 803, the voltage at the drain D of the PFET 641 being selected for measurement may now be a positive value instead of zero, and this non-zero voltage Vsense may be measured at the terminal 801. At the same time, the gate-to-drain voltage of all the other non-selected PFETs 641, instead of 0 V when there is no resistor 803, may now be at negative 0.1V (−0.1V) thereby causing a reduction in the leakage current through the non-selected PFETs 641. Since the gate-to-drain voltage of the PFET 641 selected for measurement is now non-zero, this non-zero degradation voltage Vsense is capable of being measured instead of, or in addition to, the current Idd. In one embodiment where the current sink 805 may be enabled during the stress phase, the current sink 805 may be set to 0V to ground all of the drains D of the PFETs 641. However during the measurement phase, the current sink 805 may be disabled resulting in the drain D of the PFET 641 selected for measurement rising to a higher voltage (~0.1V) as described above.

Figure 9:
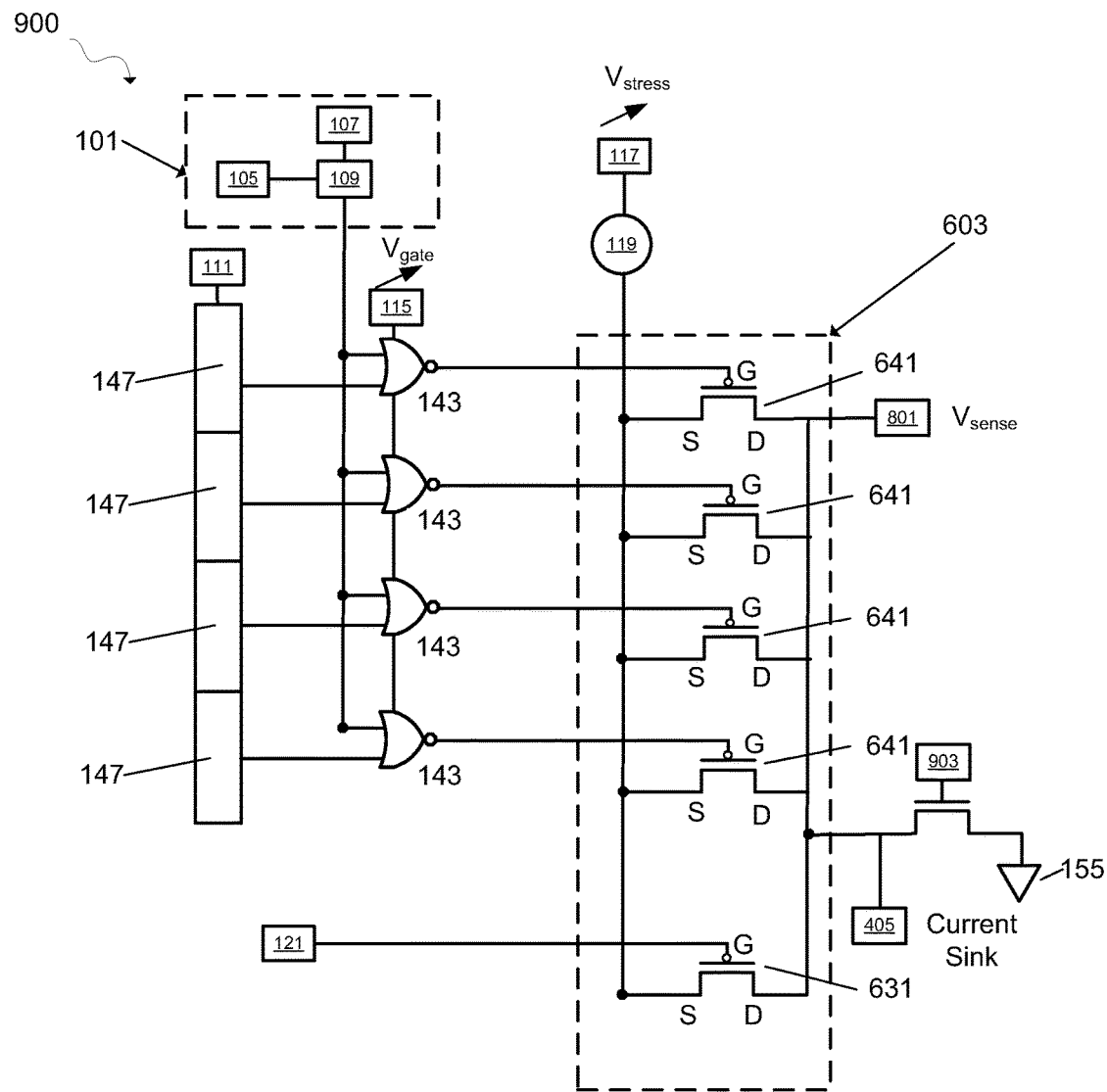
FIG. 9 illustrates a top level circuit diagram of an alternate apparatus to test reliability of an array of PFETs, according to an embodiment of the invention.

Referring now to FIG. 9, a structure 900 used to test reliability of a plurality of PFETs is shown. Structure 900 may represent an alternate means to measure degradation of PFETs wherein the drains D of all PFETs 641 in the DUT array 603 may be connected to a single variable load FET 903 whose gate voltage may be adjustable. The circuit described in FIG. 9 may, similar to the circuit described in FIG. 8, help minimize or nullify the effect of leakage currents through the other non-selected PFETs 641 on the measured value of current Idd through a selected PFET 641. For example, when a single PFET 641 is selected for measuring the effect of degradation, the single variable load FET 903 may be turned on by raising its gate voltage while the voltage Vsense at terminal 801 may be at increased to, say, 0.1 V. instead of 0 V as may be the case in the circuit configuration described in FIG. 6. As a result, the gate-to-drain voltage of all the other non-selected PFETs 641 may now be at negative 0.1V (−0.1V) instead of 0 V, thereby causing a reduction in the leakage current through the other non-selected PFETs 641. In addition, since the gate-to-drain voltage is now non-zero, this non-zero degradation voltage Vsense may be measured at terminal 801 instead of, or in addition to, the current Idd.

In typical stress circuits, the average current of all devices in the array are measured. Embodiments of the present invention may permit measurement of the current, or change of threshold voltage, of each individual device in a DUT array, using a structure of scan chain and NOR gates. Embodiments of the present invention may stress many devices in parallel using short pulses, and measure degradation of each of the devices independently to obtain accelerated estimates of the device's characteristics such as expected lifetime, or other changes that would occur over the lifetime of the device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   measuring a first set of values of a current Idd passing through each individual field effect transistor (FET) in a plurality of FETs, the plurality of FETs comprising an array of devices under test (DUT) located in a single testing circuit;
   simultaneously applying a stress voltage in parallel to one of drains and sources of all of the plurality of FETs and at least one signal to gates of all of the plurality of FETs, wherein the stress voltage and the at least one signal comprise a series of short periodic pulses applied during a low duty cycle;
   turning the at least one signal off in the gates of all of the plurality of FETs;
   turning on individual gates of individual FETs of the plurality of FETs one by one in succession such that the current Idd is conducted through each individual FET;
   measuring a second set of values of the current Idd through each individual FET in the plurality of FETs at a time when the gates of each individual FET are turned on; and
   comparing the first set of values of the current Idd to the second set of values of the current Idd to determine whether the second set of values is different from the first set of values, wherein a difference between the first set of values and the second set of values is an indication of device degradation in each individual FET of the plurality of FETs.

2. The method of claim 1, wherein the at least one signal comprises a static DC signal.

3. The method of claim 1, wherein the at least one signal comprises a pulsed signal generated by a finite state machine.

4. The method of claim 1, wherein the at least one signal comprises a pulse signal generated by an on-chip pulse generator.

5. The method of claim 1, wherein the simultaneously applying the stress voltage is achieved by setting a scan chain to propagate all zeros, and setting a pulse signal and a clock signal to apply one of a pulse signal and a static DC signal to all the gates of the plurality of FETs for a duration of time.

6. The method of claim 1, further comprising:
   reducing a leakage current of any FET in the plurality of FETs not selected for measurement by maintaining a gate-to-source voltage of non-selected FETs at a negative value during the measuring of the second set of values of the current Idd through the selected FETs.

7. The method of claim 1, further comprising:
   reducing a leakage current of any FET in the plurality of FETs not selected for measurement by maintaining a gate-to-source voltage of non-selected FETs at a negative value during the measuring of the second set of values of the current Idd through the selected FETs, and during measuring of a third set of values of a voltage through the selected FETs.

8. The method of claim 1, wherein the at least one signal comprises a short pulse received from a low frequency input clock.

9. The method of claim 1, wherein a low frequency input clock directly drives the gates of the plurality of FETs.

10. The method of claim 1, wherein the plurality of FETs are connected to a single variable load FET whose gate voltage is adjustable.

11. The method of claim 1, wherein the plurality of FETs are connected to a fixed resistor.

12. The method of claim 1, further comprising:
   repeating steps of claim 1 until the second set of values of the current Idd through the individual FETs between successive measurements of the second set of values of the current Idd through the individual FETs are substantially equal.

13. An apparatus for testing a plurality of field effect transistors (FETs), comprising:
   a current measuring device configured to measure a first set of values of a current Idd through each individual FET in a plurality of FETs, the plurality of FETs comprising an array of devices under test (DUT) located in a single testing circuit;
   a voltage source configured to apply a stress voltage in parallel to one of drains and sources of all of the plurality of FETs simultaneously with a pulsed signal source configured to apply and turn off at least one signal to gates of all of the plurality of FETs, wherein the stress voltage and the at least one signal comprise a series of short periodic pulses; and
   a scan chain configured to turn on individual gates of individuals FETs of the plurality of FETs one by one in succession such that the current Idd is conducted through each individual FET, wherein the current measuring device is configured to measure a second set of values of the current Idd through individual FETs at a time when the individual gates of the individual FETs are turned on, wherein a difference between the first set of values of current Idd and the second set of values of current Idd is an indication of device degradation in each individual FET of the plurality of FETs.

14. The apparatus of claim 13, wherein the pulsed signal source comprises a static DC signal source.

15. The apparatus of claim 13, wherein the pulsed signal source comprises a finite state machine.

16. The apparatus of claim 13, wherein the pulsed signal source comprises an on-chip pulse generator.

17. The apparatus of claim 13, wherein the pulsed signal source comprises a low frequency input clock generating a short pulse.

18. The apparatus of claim 13, wherein a low frequency input clock is configured to directly drive the gates of the plurality of FETs.

* * * * *